United States Patent
Hasunuma et al.

(10) Patent No.: US 6,436,849 B1
(45) Date of Patent: Aug. 20, 2002

(54) METHOD FOR MANUFACTURING SEMICONDUCTOR DEVICE HAVING LOW DIELECTRIC CONSTANT INSULATING FILM, WAFER PROCESSING EQUIPMENT AND WAFER STORING BOX USED IN THIS METHOD

(75) Inventors: Masahiko Hasunuma; Hideshi Miyajima, both of Yokohama; Hisashi Kaneko, Fujisawa; Rempei Nakata, Kamakura, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/963,385

(22) Filed: Sep. 27, 2001

(30) Foreign Application Priority Data

Sep. 27, 2000 (JP) .......................................... 2000-295097

(51) Int. Cl.⁷ ........................ H01L 21/31; H01L 21/469
(52) U.S. Cl. ...................... 438/778; 438/624; 438/763; 438/781; 438/790; 427/240
(58) Field of Search ................................ 438/778, 780, 438/781, 782, 790, 624, 763, 787; 427/240, 245, 246, 247, 425

(56) References Cited

U.S. PATENT DOCUMENTS

| | | | | |
|---|---|---|---|---|
| 5,371,046 A | * | 12/1994 | Liaw et al. | 438/624 |
| 5,661,093 A | * | 8/1997 | Ravi et al. | 438/763 |
| 6,037,274 A | * | 3/2000 | Kudo et al. | 438/778 |
| 6,327,793 B1 | * | 12/2001 | Gurer et al. | 34/317 |

OTHER PUBLICATIONS

Wiederhorn, "Influence of Water Vapor on Crack Propagation in Soda–Lime Glass," Journal of The American Ceramic Society, 50 (8) :407–414, Aug. 1967.

* cited by examiner

Primary Examiner—Chandra Chaudhari
Assistant Examiner—Timothy Sutton
(74) Attorney, Agent, or Firm—Finnegan, Henderson, Farabow, Garrett & Dunner, L.L.P.

(57) ABSTRACT

A method for manufacturing a semiconductor device, comprising controlling a humidity in an atmosphere around a low dielectric constant insulating film at 30% or less, during a processing period and a transfer period between processing equipments, in which at least a part of said low dielectric constant insulating film is exposed to the atmosphere.

9 Claims, 8 Drawing Sheets

FIG.1A

LKD : 900nm

FIG.1B

LKD : 983nm

FIG.2

LKD FILM THICKNESS (nm)

FIG.3

|  |  | STORING TEMPERATURE | | | |
|---|---|---|---|---|---|
|  |  | 23°C | 50°C | 75°C | 100°C |
| STORING HUMIDITY | 10% | 2 | 2 | 2.5 | 2.5 |
| | 25% | 2 | 2 | 2.5 | 2.5 |
| | 30% | 1.5 | 1.5 | 2 | 2.5 |
| | 36% | 1 | 1 | 1.5 | 1.5 |
| | 40% | 1 | 1 | 1.5 | 1.5 |

METHOD FOR MANUFACTURING SEMICONDUCTOR DEVICE HAVING LOW DIELECTRIC CONSTANT INSULATING FILM, WAFER PROCESSING EQUIPMENT AND WAFER STORING BOX USED IN THIS METHOD

CROSS REFERENCE TO RELATED APPLICATION

This application claims benefit of priority under 35USC 119 based on Japanese Patent Application No. P2000-295097, filed on Sep. 27, 2000, the entire contents of which are incorporated by reference herein.

BACKGROUND OF THE INVENTION

1. Field of the Invention

The present invention relates to a method for manufacturing a semiconductor device having a low dielectric constant insulating film, to a wafer processing equipment depositing and exposing a low dielectric constant insulating film, and to a wafer storing box storing a semiconductor wafer during transfer between wafer processing equipments. More particularly, the present invention relates to a method for manufacturing a semiconductor device using an interlayer insulating film, including the low dielectric constant insulating film, which has weak properties as to the peeling or cracks of a film and the like.

2. Description of the Related Art

Along with a recent progress in highly integrated and miniaturized semiconductor integrated circuits, a manufacturing system for a semiconductor integrated circuit is usually disposed in a clean room. The temperature of the clean room is controlled at about 23° C. under a relative humidity (RH) of about 40% with the intention of removing dusts and static electricity. A semiconductor wafer during the course of manufacture is exposed to a clean room atmosphere, which is controlled in the above temperature and humidity condition for a undefined period of time. The undefined period of time includes during carrying-in and carrying-out of the wafer from various wafer processing units and during the transfer and storage between manufacturing stages.

On the other hand, a recent progress in large-scaled and high-speed semiconductor integrated circuits is accompanied by progresses in multi-level of wiring and thin interlayer insulating films. However, the decrease of the thickness of the thin interlayer insulating film increases a parasitic capacitance between wirings, which is an obstacle to a high-speed circuit operation. In order to decrease the parasitic capacitance between wirings, a low dielectric constant insulating film, known as "low k" film is required as the interlayer insulating film. As the low k dielectric film may include a silicon oxide ($SiO_2$) film containing an organic component (hereinafter referred to as "LKD" film) and a fluorinated silicon oxide film (SiOF film). The SiOF film is generally called "FSG film (Fluorinated Silica Glass film)". The SiOF film is reduced in dielectric constant by adding fluorine to silicon oxide ($SiO_2$). Multi-level wiring technologies using these low dielectric constant insulating films as the interlayer insulating films are commonly used.

BRIEF SUMMARY OF THE INVENTION

An aspect of the present invention inheres in a method for manufacturing a semiconductor device comprising controlling a humidity in an atmosphere around a low dielectric constant insulating film at 30% or less during a processing period and a transfer period between processing equipments in which at least a part of the low dielectric constant insulating film is exposed to the atmosphere.

Another aspect of the present invention inheres in a wafer processing equipment comprising a wafer processing chamber which provides a semiconductor wafer with a predetermined treatment, a transfer tube which is connected to the wafer processing chamber and through which the wafer is carried into and out from the wafer processing chamber, and a humidity control unit which controls the humidity of the transfer tube at 30% or less.

Still another aspect of the present invention inheres in a wafer storing box comprising a wafer storing chamber which stores a semiconductor wafer on which a low dielectric constant insulating film is deposited, and a humidity control unit which controls the humidity of the wafer storing chamber at 30% or less.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EXPERIMENTAL EXAMPLE

Low dielectric constant insulating films generally have a low Young's modulus and hence low breaking toughness correlated with the Young's modulus. Therefore, the low dielectric constant insulating films involve the problem as follows. Cracks (self-cracks) occur in a self-breaking manner if the low dielectric constant insulating films are thickened. Cracks is made to progress by chemical mechanical polishing (CMP), and by scratches caused during the course of manufacture, for example, during the course of the transfer of a wafer.

It has been clarified from our studies as follows. In the vicinity of a metal wiring in which Young's modulus and linear expansion coefficient differ from the low dielectric constant insulating film, the thermal stress in manufacturing process is concentrated. In spite of being thinner than the limitative film thickness that causes the self crack in the solid states, the self crack is generated in the low dielectric constant insulating film, and this self crack progresses.

This concentration of stress disturbs the formation of a thick interlayer insulating film. The progress of cracks causes vital defects such as wiring failures, for example, the short circuits between wirings in the same level and between vertically stacked levels.

Moreover, the low dielectric constant insulating films generally have high hygroscopicity and gas permeability. Even if the low dielectric constant insulating film is exposed to the above clean room atmosphere only for a very short time, it adsorbs moisture, and gas is left resultantly. Particularly, if the SiOF film has adsorbed the moisture once, it will releases the water when heated. Also this water reacts with fluorine contained in the SiOF film, to release fluorine (F) in the form of hydrogen fluoride (HF). It is known that this causes the following hindrances resultantly.

(1) The formation of an upper level film is inhibited, when the upper level film is formed on the low dielectric constant insulating film.

(2) The adhesion of the upper level film, particularly an upper level metal film is deteriorated.

(3) The dielectric constant of the LKD film is raised.

(4) Resistance to cracks is deteriorated.

These hindrances become serious problems in the manufacturing of semiconductor devices using the low dielectric constant insulating film. For this, a semiconductor device is frequently heated to remove water. Or the SiOF film is coated with a $SiO_2$ film (cap film), to which no fluorine is added, to prevent the SiOF film from being exposed, thereby avoiding the above hindrances.

However, because a process of removing water or a process of applying the cap film are added, the number of processes is increased, leading to increased costs. It is not said to take sufficient measures for solving the problems concerning the moisture absorption and the residual gas, only by the frequent heating treatments and the use of the cap film. For example, the SiOF film adsorbs moisture in a short period of time, until the cap film is formed since the SiOF film is formed. Even if after the SiOF film is formed, the SiOF film is not allowed to stand in the atmosphere. The cap film is successively formed in the same equipment. A part of the SiOF film is exposed again when the surface of the cap film is processed utilizing a dry etching process and a CMP process. As a result, SiOF film adsorbs moisture from the exposed portion at a period between the cap film processing stage and the next stage. Therefore, the above hindrances (1) to (4) cause the defects of semiconductor devices. It is desired to take prompt measures to solve these problems.

The present inventors have discovered from the results of these studies as follows. The above hindrances are caused by the fact, that a Si—O bond (bond between silicon and oxygen) of the low dielectric constant insulating film becomes easy to be cut by Stress Corrosion Cracking (SCC). Particularly, a Si—O bond, connecting between ladder structures, is weak in the case of a $SiO_2$ film containing an organic component.

Then, the inventors considered that the above defects can be limited by removing water and stress which are the causes of these defects. Then, various experiments as will be explained later have conducted, to complete the present invention based on the results of these experiments.

Examples of the experiments conducted by present inventor will be explained, prior to explanations of the embodiments of the present invention.

When an LKD film increased in thickness is exposed to a clean room atmosphere, cracks occur in a self-breaking manner (self-crack). The critical film thickness allowing this self-crack to occur is about 1.5 $\mu$m though it varies depending on the kind of film.

Moreover, it has been confirmed for the first time as follows. Even if an LKD film is made thin to the extent, cracks propagates at a rate corresponding to the film thickness by scratching the surface of the LKD film. In the above extent, no crack occurs in the condition that it is exposed to a natural atmospheric ambient.

Further, it has been confirmed as follows. When a metal wiring is arranged in the vicinity of the LKD film, thermal stress is concentrated on the LKD film close to the metal wiring. The metal wiring is different in Young's modulus and linear expansion coefficient from the LKD film. Therefore self-cracks occur even if the thickness is less than the critical film thickness, which define the thickness to allow the self-cracking. The propagation of cracks of the scratched portion is accelerated.

Further, it has been confirmed as follows. The presence of such cracks causes fatal defects such as the development of short circuits of wirings, when current is applied.

Figure 1A:
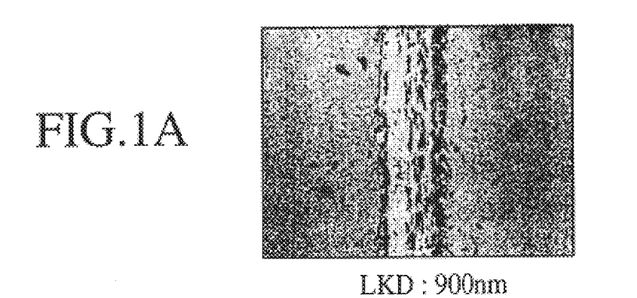
FIG. 1A is a plan view showing a scratch formed on the surface of an LKD film having a film thickness of 900 nm.
Figure 1B:
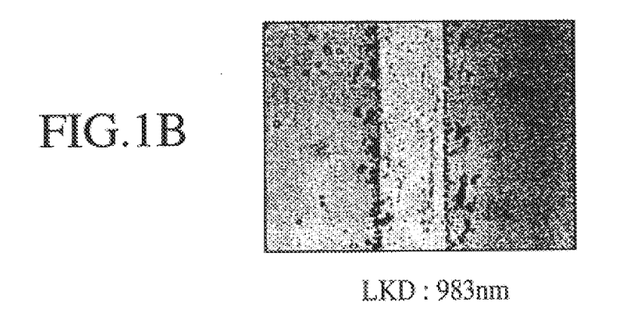
FIG. 1B is a plan view showing a scratch formed on the surface of an LKD film having a film thickness of 983 nm.

FIGS. 1A and 1B are plan views respectively showing the shapes of the scratches formed on the surfaces of the LKD films. FIG. 1A shows the case where the film thickness of the LKD film is 900 nm. FIG. 1B show the case where the film thickness of the LKD film is 983 nm.

Two samples of FIG. 1A are formed, which have the LKD films with film thickness of 900 nm on the thermal oxide films having thickness of 100 nm, which are formed on Si substrates. Another two samples of FIG. 1B are formed, which have the LKD films with thickness of 983 nm on the thermal oxide films. These samples were scratched as shown in FIG. 1A and FIG. 1B, and exposed to the atmospheric ambient, which is controlled at room temperature (23° C.) under a humidity of 25% for 35 days. Moreover, the still another samples, having the same film structures and provided with scratches, were exposed to the atmospheric ambient, controlled at 75° C. under a humidity of 30% for 35 days. As a result, any propagation of cracks was not found in all samples.

Figure 2:
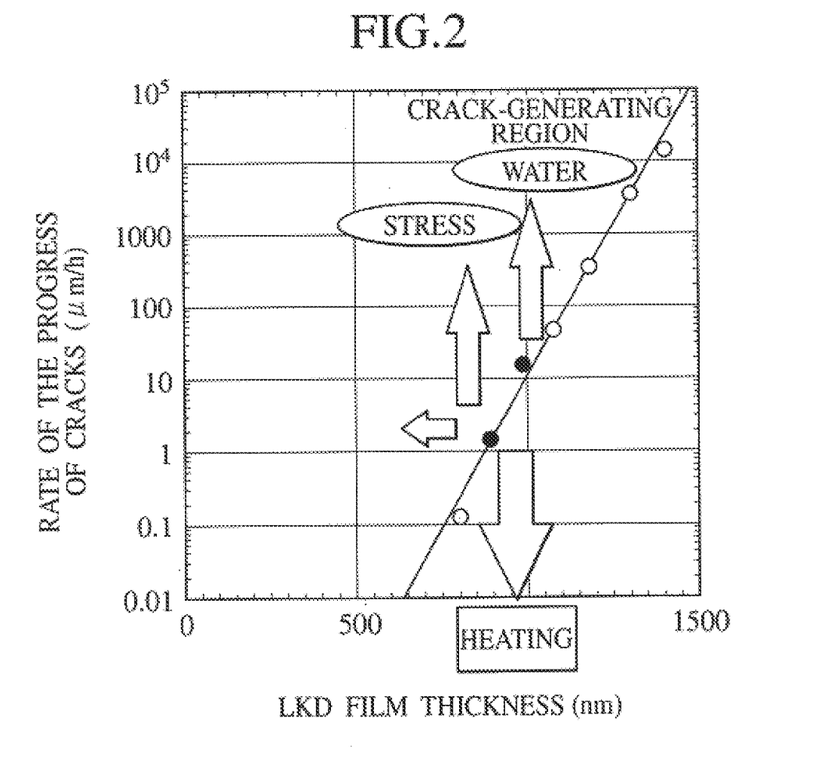
FIG. 2 is a graph showing the relationship between the rate of the progress of cracks of an LKD film in a clean room atmosphere and the film thickness of the LKD film.

FIG. 2 is a graph showing the relationship between the rate of the propagation in the cracks of the LKD film in a clean room atmosphere and the film thickness of the LKD film. As shown in FIG. 2, in the case of exposing the sample to the clean room atmosphere, controlled at the humidity of 40% and the temperature of 23° C., cracks of the sample with the film thickness of 900 nm propagated at a rate of 1.5 $\mu$m/hr. Cracks of the sample with the film thickness of 983 nm propagated at a rate of 17 $\mu$m/hr. Both samples resulted in peeling of the film, finally. It was also found from similar experiments in other conditions, that the logarithm of the rate of the propagation of cracks increased in proportion to the film thickness of the LKD film, as shown in FIG. 2.

Moreover, the humidity and the temperature were changed. As a result, no propagation of cracks was observed by controlling the humidity at 30% or less when the temperature was controlled at 75° C. And also, no propagation of cracks was observed by controlling the humidity at 25% or less when the temperature was controlled to be at 23° C. It is to be noted that even if the sample was exposed to high humidity for a short time, there was no problem.

Next, boron-phosphate-silicate-glass (BPSG) and further d-Tetraethoxysilane (TEOS) were laminated above a Si substrate, on which an active region and a gate electrode were formed. Then, a tungsten (W) plug was formed. Five LKD films, having thicknesses of 1 $\mu$m, 1.5 $\mu$m, 2 $\mu$m, 2.5 $\mu$m and 3 $\mu$m as final thicknesses after baked, were formed. The method of forming the LKD film and the experimental method are as follows.

First, varnish obtained by dissolving polymethylsiloxane in a solvent, was applied by a spin coater. Thereafter, the varnish was cured at 80° C. for one minute. In succession, the varnish was cured at 200° C. for one minute. Further the varnish was baked at 450° C. for 30 minutes. The humidity in this course is due to water generated during baking. The flow rate of nitrogen gas was controlled, such that the humidity in this course was lower than the storing humidity shown in FIG. 3. After baked, when the temperature of the substrate was dropped to each temperature shown in FIG. 3, the sample was allowed to pass through a transfer chamber. Then the sample was allowed to transfer to a storing box, which is controlled at each storing temperature and humidity shown in FIG. 3. After the sample was stored in the storing box for 30 days, it was confirmed whether cracks were present. The sample was irradiated with intense light. The evaluation of resistance to cracks was made by whether or not scattered light was observed using an optical microscope. The value of the maximum film thickness, at which the generation of cracks was not found, is described together in FIG. 3.

Figure 3:
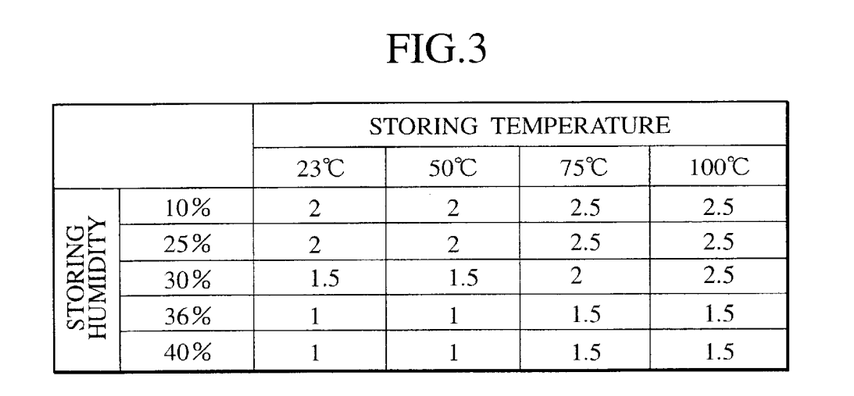
FIG. 3 is a table showing storing temperature and humidity in a storing box and the value of maximum film thickness of an LKD film when no cracks occurs.

Films of d-TEOS/p-SiN were formed in thickness of 400 nm/400 nm respectively, on the upper level of the sample transferred in the atmosphere of FIG. 3. Then the sample was stored in an atmosphere controlled at 23° C. and a humidity of 40% for 30 days. The sample was measured whether or not cracks were present. As a result, the same results as those shown in FIG. 3 were obtained.

From the above results, besides it was dependent on the film thickness that the propagation of cracks from the scratch and self-cracks caused by the formation of a thick film, the following three points were newly confirmed.

(1) Humidity dependency: if the humidity during storage was changed, the higher the humidity was, the higher the propagation rate of cracks was. And also the higher the humidity was, the thinner the critical film thickness at which the propagation of self-cracks started was. In an extreme case where the sample was exposed to water, such tendency became more significant. On the contrary, if the humidity was decreased, a quite inverse tendency was exhibited. If the humidity was controlled at 25% or less, it was possible to stop the propagation of cracks from the scratch. Moreover, the humidity in whole process, including water generated when the LKD film was condensed, was controlled at 25% or less. As a result, the critical film thickness of spontaneous cracks could be made very large. The above results were very significant when the humidity was 25%, but rather good even if the humidity was 30% or less.

(2) Temperature dependency: Moreover, when the sample was stored in a manner that the temperature of the LKD film was not dropped to 75° C. or less by heating, any propagation of cracks was not observed at all. The critical film thickness of the self-cracks, caused by the formation of a thick film, can be made high.

(3) Stress dependency: When tensile stress was further applied to the LKD film with the scratch, by using a four-point bending tester, the propagation rate of cracks was accelerated. It was clarified form the results of measurement of film stress, that stress applied to the film was relaxed, by controlling the samples at higher temperatures.

SECOND EXPERIMENTAL EXAMPLE

Figure 4:
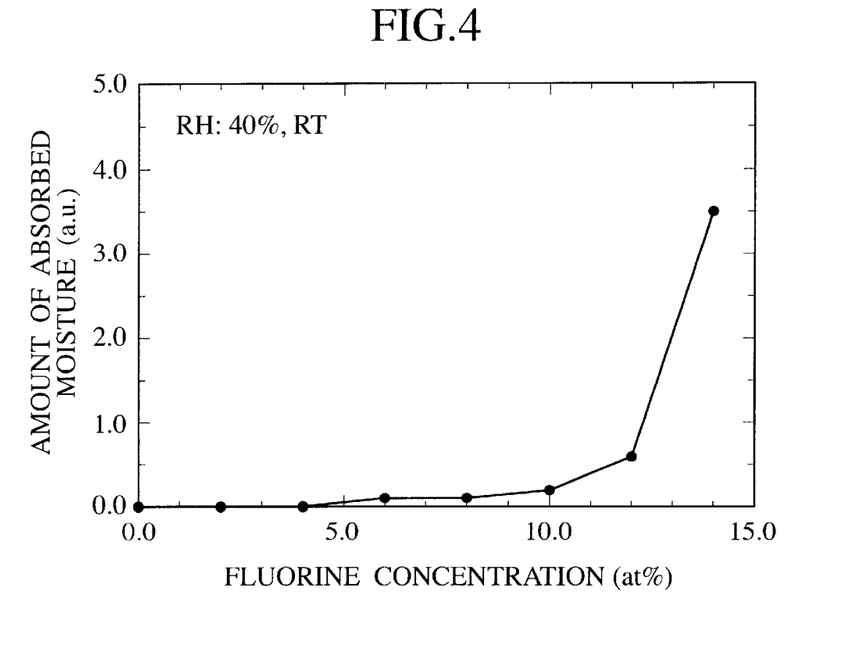
FIG. 4 is a graph showing the relationship between the concentration of fluorine (F) in an SiOF film used as a low dielectric interlayer insulating film and water content (that is, the amount of the adsorbed moisture) contained in the SiOF film after the film is allowed to stand for one week in a normal clean room atmosphere after it is deposited.

FIG. 4 is a graph showing the relationship between the concentration of fluorine (F) in an SiOF film, used as a low dielectric constant insulating film, and water content (that is, the amount of the adsorbed moisture) contained in the SiOF film. The SiOF film has been exposed for one week to a clean room atmosphere. The clean room atmosphere is controlled at a related humidity (RH) of 40% and the room temperature (RT) of 23° C. The SiOF film was deposited by using a high density plasma CVD apparatus of Applied Materials, Inc. As the source gas for CVD, mixture gas of $SiH_4/SiF_4/O_2/Ar$ was used here. Moreover, the evaluation for the amount of adsorbed moisture was made by analyzing the SiOF film having thickness of 500 nm. The analysis of the SiOF film was done by using a Fourier Transfer Infrared (FT-IR) analyzer. The amount of adsorbed moisture is expressed by the ratio of the sum of the Si—OH peak and the H—OH peak, which are observed in the vicinity of 3500 $cm^{-1}$, to the area of the Si—O peak observed in the vicinity of 1100 $cm^{-1}$.

With the originality and ingenuity of the present inventors, the condition, under which the SiOF film is formed, is regulated so that the adsorbed moisture after exposed to the atmosphere can be limited to a low level.

However, as is clear from FIG. 4, it is understood that the amount of adsorbed moisture after one week exposure increases, as the concentration of F in the film increases. Particularly, it is understood that the amount of adsorbed moisture increases rapidly, surmounting the borderline where the concentration of fluorine in the film becomes 10%.

Figure 5:
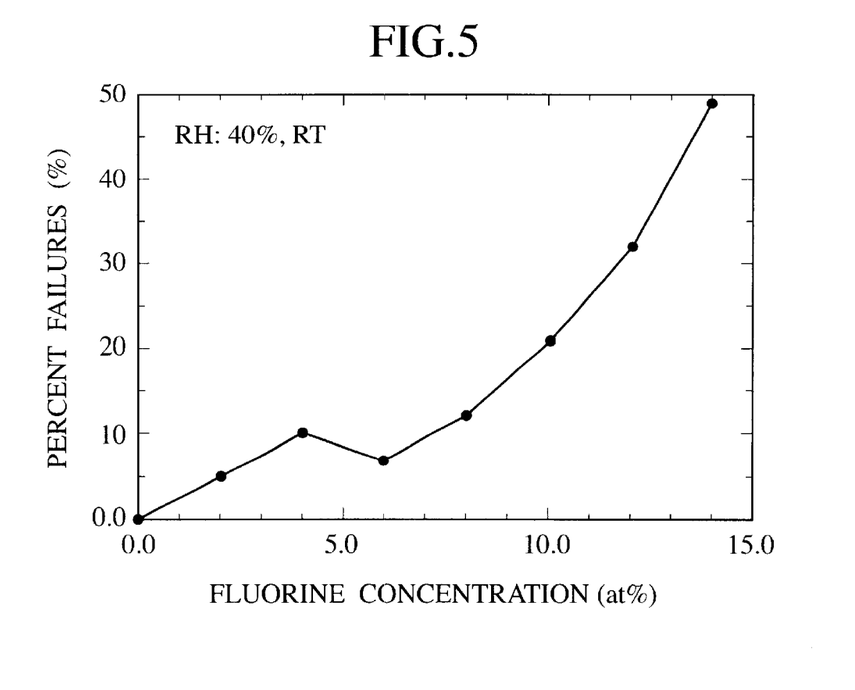
FIG. 5 is a graph showing the relationship between the concentration of F in a SiOF film and percent failures ascribable to the SiOF film during the course of a method for manufacturing a semiconductor device in a normal clean room atmosphere.

FIG. 5 is a graph showing the relationship between the concentration of F in the SiOF film and percent failures, The failures ascribable to the SiOF film, formed during the course of manufacturing a semiconductor device in a normal clean room atmosphere. "The failures ascribable to the SiOF film" are caused not only by the released water during heating in the subsequent stage, but also by releasing HF, after the reactions of moisture with F in the SiOF film. The failures ascribable to the SiOF film generate the following disadvantages. (1) The deposition of the film is inhibited when a film of the upper level is formed. (2) The adhesion of an upper level film, particularly, an upper level metal film is deteriorated. (3) the dielectric constant of the SiOF film is increased. As is clear from FIG. 4 and FIG. 5, it is understood that the amount of moisture adsorbed by the SiOF film after one week exposure is closely related to the percentage failures ascribable to the SiOF film.

Figure 6:
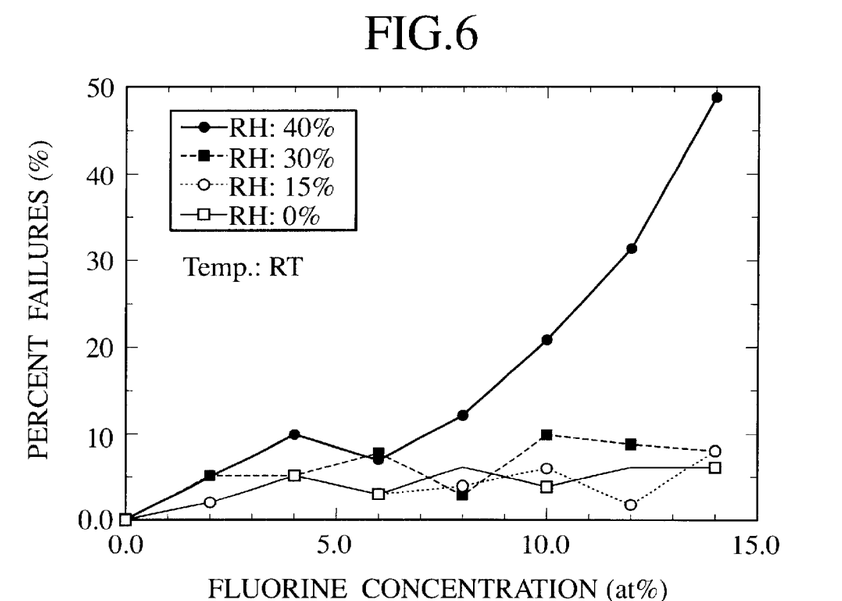
FIG. 6 is a graph showing the relationship between the concentration of F in a SiOF film and percent failures ascribable to the SiOF film when the temperature of the atmosphere around a semiconductor wafer is fixed at room temperature (RT) and the humidity of the atmosphere is changed.
Figure 7:
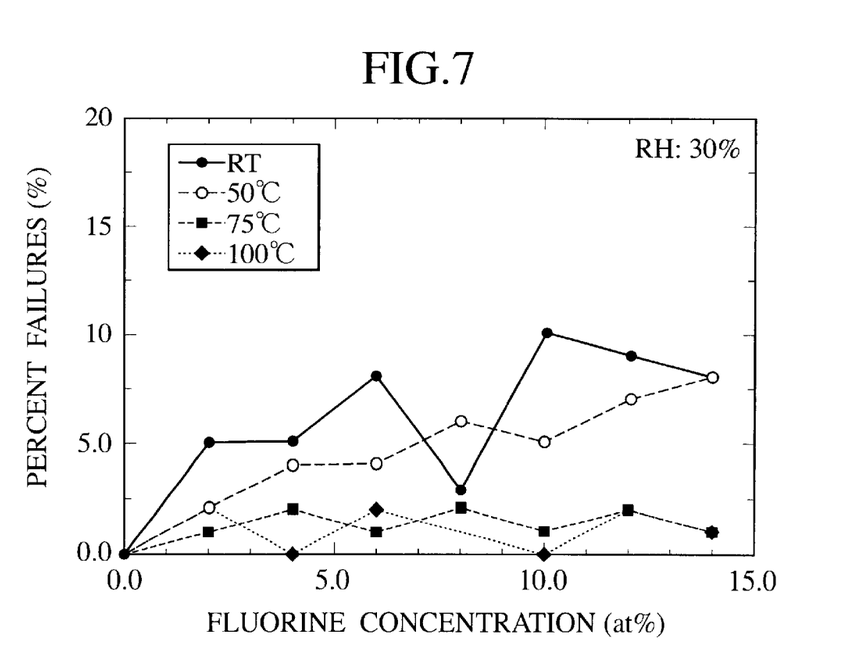
FIG. 7 is a graph showing the relationship between the concentration of F in a SiOF film and percent failures ascribable to the SiOF film when the relative humidity (RH) of the atmosphere around a semiconductor wafer is fixed to 30% and the temperature of the atmosphere is changed.

FIG. 6 is a graph showing the relationship between the concentration of F in the SiOF film and percent failures ascribable to the SiOF film. In FIG. 6, the temperature of the atmosphere around a semiconductor wafer is fixed to room temperature (RT), and the humidity of the atmosphere is changed. FIG. 7 is a graph showing the relationship between the concentration of F in the SiOF film and percent failures ascribable to the SiOF film. In FIG. 7, the related humidity (RH) of the atmosphere around a semiconductor wafer is fixed to 30%, and the temperature of the atmosphere is changed. As is clear from FIG. 6, the percent failures ascribable to the SiOF can be limited to a low level, regardless of the concentration of fluorine, by controlling the related humidity (RH) at 30% or less at room temperature. As is clear from FIG. 7, it is understood that controlling the temperature at 75° C. or more, when the humidity is 30%, further increases the effect of suppressing the percent failures to a low level.

THIRD EXPERIMENTAL EXAMPLE

The dielectric constant of the "low dielectric constant insulating film" in the embodiment of the present invention, is defined based on experimental examples shown below. A thermal oxide film with a thickness of 100 nm was formed on a silicon substrate. Various low dielectric constant insulating films were formed in a thickness of 1 μm. Thereafter, the following three treatments were carried out, in order to measure the percent failures. The measurement of the percent failures is based on whether or not the cracks of these various low dielectric constant insulating films were present. And also the measurement of the percent failures is based on whether or not the tantalum (Ta) film was peeled off.

(1) The silicon substrate was exposed to an atmosphere controlled at a humidity of 40% and a temperature 23° C. After that, it was confirmed whether or not cracks were present.

(2) A scratch was formed. Then the silicon substrate was exposed to an atmosphere controlled at a humidity of 40% and a temperature 23° C. for one week. After that, it was confirmed whether or not cracks were present.

(3) The substrate was exposed to an atmosphere controlled at a humidity of 40% and a temperature of 23° C. After that, a Ta film was formed. Then, the substrate was subjected to heat treatment at 400° C. Thereafter, it was confirmed whether or not the Ta film was peeled off.

Figure 8:
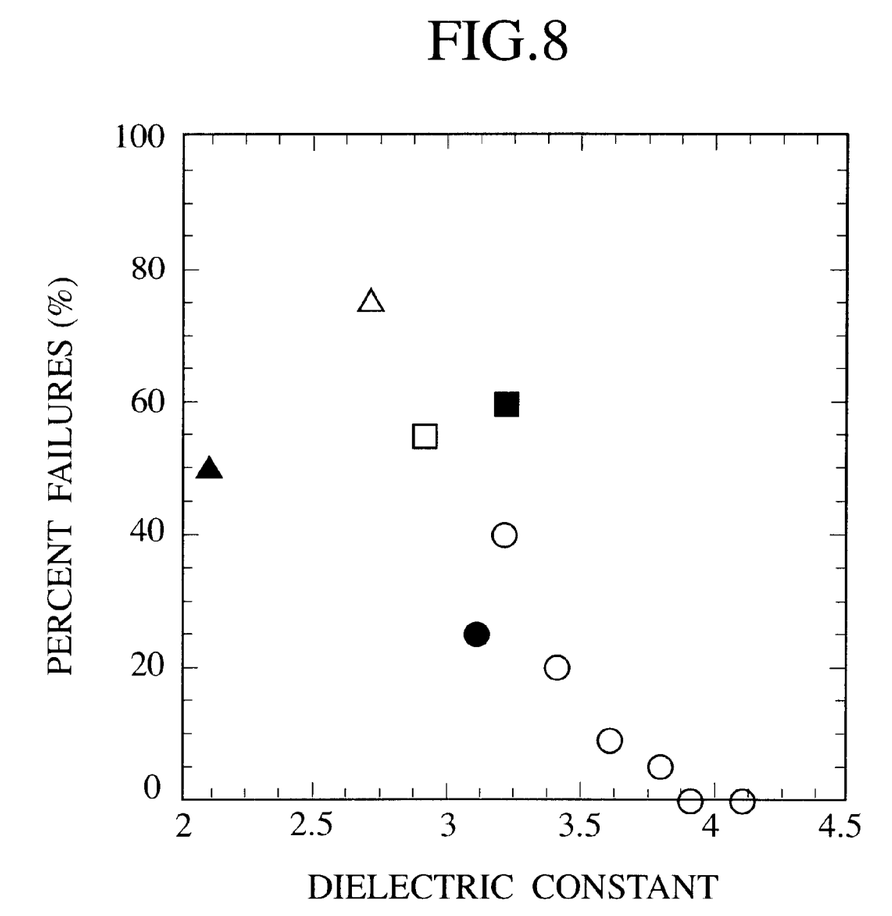
FIG. 8 is a graph showing the relationship between the dielectric constant and percentage failures of various low dielectric constant insulating films.

FIG. 8 is a graph showing the relationship between the dielectric constant and percentage failure of various low dielectric constant insulating films. As shown in FIG. 8, it was found that failures occur frequently when the dielectric constant was 3.8 or less. The value of the percentage failures depends on the material quality of the low dielectric constant insulating film. From these experimental results, insulating films having a dielectric constant of 3.8 or less, is defined as the "low dielectric constant insulating film" in the embodiment of the present invention.

Here, the low dielectric constant insulating film includes the LKD film and the SiOF film. The low dielectric constant insulating film includes the insulating film, in which a propagation of the cracks is much accelerated. The low dielectric constant insulating film includes the insulating film having the low Young's modulus. "The LKD film" is a $SiO_2$ film containing an organic component. The LKD film is manufactured as follows. A liquid raw material, called varnish, is coated on the substrate, and sintered. The following are carried out: the volatilization of a solvent and cross-link (polymerization reaction) of the precursor. The $SiO_2$ film containing an organic component is characterized by the inclusion of a methyl group ($—CH_3$) or an ethyl group ($—C_2H_5$) in atomic bonds. Moreover, the low dielectric constant insulating film contains the inorganic coating film, comprising an inorganic material such as hydrogen-silsesquioxane. And also, the low dielectric constant insulating film contains an organic coating film, comprising an organic material such as polyallylene ether.

From the above experimental result, the followings are confirmed. The generation or the propagation of the crack of the low dielectric constant insulating film can be suppressed, by controlling the atmospheric ambient around the semiconductor wafer. The atmospheric ambient, to which at least the part of the low dielectric constant insulating film is exposed, must be controlled to be 30% humidity or less. It is to be noted that the same effect can be obtained, also by controlling the temperature of the atmospheric ambient around the low dielectric constant insulating film to be at 75° C. or more, instead of controlling the humidity. In a method for manufacturing a semiconductor device according to the embodiment of the present invention, "a processing period in which at least a pan of a low dielectric constant insulating film is exposed" may include: depositing the low dielectric constant insulating film; exposing at least a part of the low dielectric constant insulating film; coating all of the exposed part with a metal film or with an insulating film having a dielectric constant of more than 3.8; and all wafer processing period performed during these actions. Further, the period "a transfer period between processing equipments" includes; the period required to transfer a semiconductor wafer during the course of manufacture between respective wafer processing equipments used in these wafer processing stages; and the period required to store the semiconductor wafer during the course of manufacture.

FIRST EMBODIMENT

Figure 9:
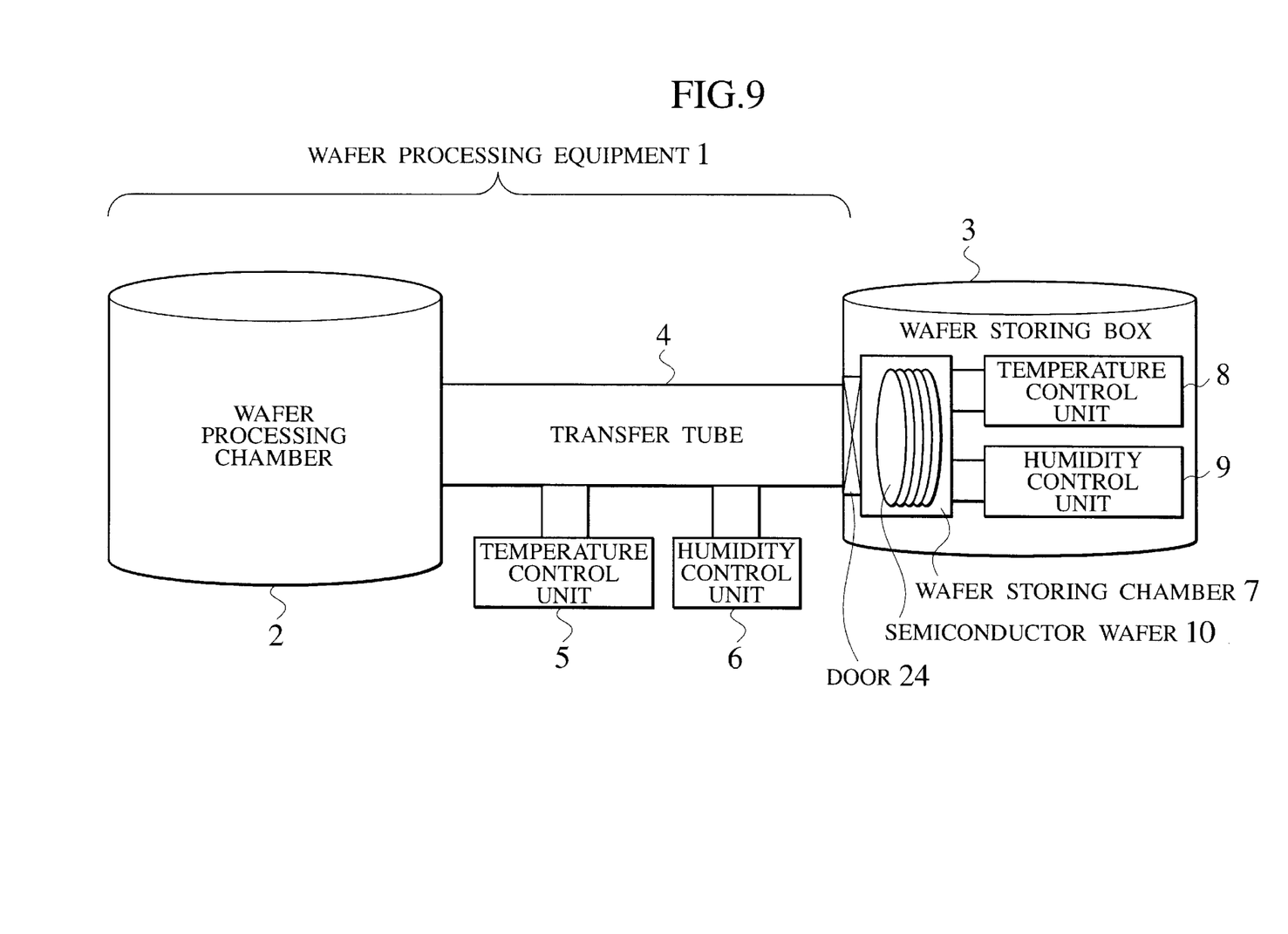
FIG. 9 is a block diagram showing the structures of a wafer processing equipment and a wafer storing box according to a first embodiment of the present invention.

Hereinafter, the first embodiment of the present invention will be explained with reference to the drawings. FIG. 9 is a block diagram showing the structures of a wafer processing equipment 1 and a wafer storing box 3, according to the first embodiment. As shown in FIG. 9, the wafer processing equipment 1 encompasses a wafer processing chamber 2, a transfer tube 4 which is connected to the wafer processing chamber 2, a humidity control unit 6 which controls the humidity at 30% or less under control in the transfer tube 4, and a temperature control unit 5 which controls the temperature at 75° C. or more in the transfer tube 4. The semiconductor wafer is carried into and out from the wafer processing chamber 2 through the transfer tube 4.

The wafer processing equipment 1 may be one of various apparatuses used in manufacturing stages, in which at least a part of the low dielectric constant insulating film (for example, the LKD film) is exposed to a clean room atmosphere. For example, the apparatuses may be the LKD film deposition apparatus, a TEOS film deposition apparatus, a reactive ion etching (RIE) apparatus, and a metal film deposition apparatus. The LKD film deposition apparatus deposits an LKD film on the semiconductor wafer. The TEOS film deposition apparatus deposits on the whole exposed surface of the LKD film, a TEOS film as an ordinary insulating film. The RIE apparatus digs the holes and grooves such that a part of the LKD films are exposed on the sidewalls by selectively removing the TEOS film and the LKD film. The metal film deposition apparatus deposits on the whole exposed portion of the LKD film a metal film, the metal film covers on the hole, the groove and the TEOS film. The wafer processing equipment 1 involves, besides the above apparatuses, another apparatus exposing at least a part of the LKD film by) such as, a flattening machine employed in the CMP process, and a washing equipment cleaning the surface of the wafers between exposing the LKD film and the coating LKD film. In short, the wafer processing equipment 1, in the first embodiment, includes all of the apparatuses associated with depositing the low dielectric constant insulating film, exposing at least a part of the low dielectric constant insulating film, coating the whole of the exposed part, and another wafer processes performed between these executions.

The atmosphere surrounding the semiconductor wafer in the wafer processing chamber 2 is controlled at a humidity of 30% or less and a temperature of 75° C. or more. The transfer tube 4 is integrated with the wafer processing chamber 2, integrated with the wafer storing box 3, and formed in a detachable manner through a flange. In the transfer tube 4, a movable carrier (not shown) is disposed. The movable carrier carries the semiconductor wafer in and out from the wafer processing chamber 2. The humidity control unit 6 desirably controls the humidity at 25% or less in the transfer tube 4. For preventing dielectric breakdown or device destruction by the static electricity, it is desirable that the humidity control unit 6 has an ion generation apparatus. By having the ion generation apparatus, it is possible to perfectly suppress the generation of the trouble by the electrostatic destruction.

The wafer storing box 3 protects the semiconductor wafer from the external atmosphere, when transferring the semiconductor wafer between the wafer processing chamber 2 and the wafer storing box 3 in each of the processing equipments 1. Moreover, the wafer storing box 3 controls the atmosphere around semiconductor wafers when the semiconductor wafers, in which at least a part of a low dielectric constant insulating film are exposed, are stored. The wafer storing box 3 encompasses a wafer storing chamber 7, a humidity control unit 9, and a temperature control unit 8. The wafer storing chamber 7 stores the semiconductor wafer, on which the low dielectric constant insulating film is deposited. The humidity control unit 9 controls the humidity in the wafer storing chamber 7 at 30% or less. The temperature control unit 8 controls the temperature in the wafer storing chamber 7 at 75° C. or more. The wafer storing chamber 7 has a size and shape enough to store one or plural semiconductor wafers 10. The semiconductor wafers 10 stored in the wafer storing chamber 7 are aligned, standing at each edges.

The wafer storing box 3 is further provided with a door 24. The door 24 is opened and closed in close contact with an inlet/outlet port of the transfer tube 4. The size of the door 24 is adjustable to the size of the inlet/outlet port of the transfer tube 4. Further, the height of the door 24 is adjustable to the height of the inlet/outlet port of the transfer tube 4. This makes it possible to carry semiconductor wafers in and out from respective wafer processing equipments 1 by using one wafer storing box 3, even if the sizes of the ports are different for the every equipments 1. In the condition that the humidity and temperature around the semiconductor wafers are controlled, the wafers can be carried in and out the respective wafer processing equipments 1 and the wafer storing box 3 through the door 24. The humidity control unit 9 desirably controls the humidity in the wafer storing chamber 7 at 25% or less. For preventing dielectric breakdown or device destruction by the static electricity, it is desirable that the humidity control unit 9 has an ion generation apparatus. By having the ion generation apparatus, it is possible to perfectly suppress the generation of the trouble by the electrostatic destruction.

Figure 10:
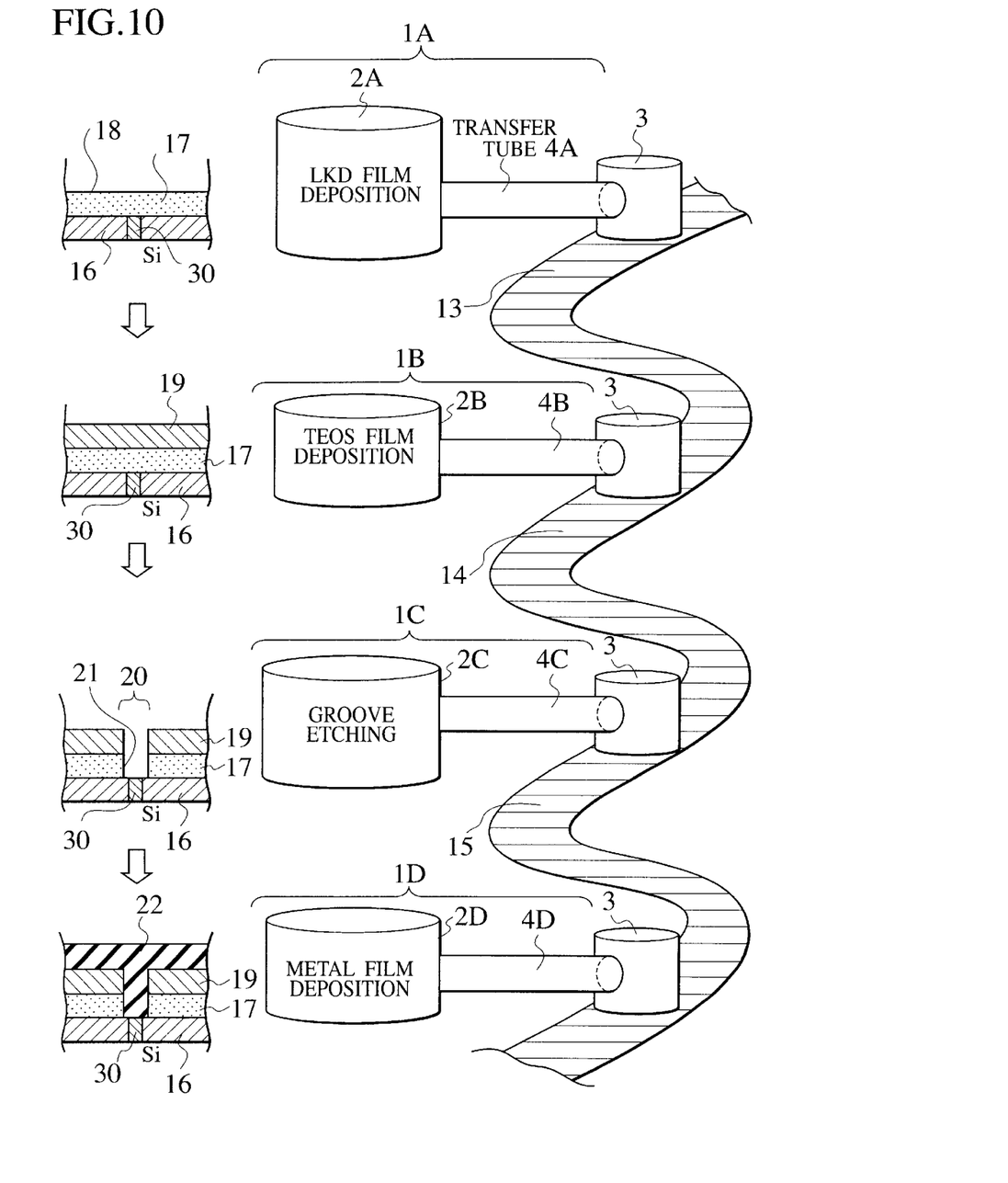
FIG. 10 is a flowchart showing a method for manufacturing a semiconductor device according to the first embodiment of the present invention.

A method for manufacturing a semiconductor device, according to the first embodiment of the present invention, will be explained with reference to FIG. 10. The manufacturing method uses the wafer processing equipment 1 and the wafer storing box 3, shown in FIG. 9. The manufacturing method shown by the flowchart of FIG. 10 involves the first to the fourth processes. The center line of the flowchart shows wafer processing chambers (2A to 2D) and transfer tubes (4A to 4D) relating to each process. The broad right line on the right side of the flowchart shows the wafer storing boxs 3 for transferring the semiconductor wafer between each wafer processing equipment (2A to 2D). On the left side of the flowchart, the cross sectional views corresponding to the respective processes are arranged vertically.

(a) At first, the low dielectric constant insulating film (for example, LKD film) 17 with a film thickness of 1.5 μm is deposited above a semiconductor wafer (base substrate), by using first wafer processing equipment (spin coater) 1A. The predetermined substrate treatment stages are carried out, before a LKD film is deposited. The predetermined substrate treatment stages including the formations of element isolation regions, transistors, gate wirings, BPSG 16, and W plug 30. More specifically, tile semiconductor wafer, secured to a sample table in a spin coating chamber 2A, is rotated. A liquid source material for a low dielectric constant insulating (for example, LKD film) 17 is applied to the semiconductor wafer. The liquid source material is cured in a nitrogen atmosphere, having a humidity of 30% or less. In succession to the low temperature curing, the wafer is baked at 450° C. for 60 minutes. After the LKD film 17 is deposited on the BPSG 16, the surface 18 of the LKD film is exposed to an atmosphere in the spin coating chamber 2A. The atmosphere of the spin coating chamber 2A, after the LKD film 17 is deposited, is controlled at a humidity of 30% or less and a temperature of 75° C. or more. After baked, the temperature of the substrate is dropped to 75° C. At the same time, the atmosphere of the transfer tube 4A is controlled at a humidity of 30% or less and a temperature of 75° C. or more. Then, the semiconductor wafer, in which the LKD film 17 is exposed, is carried out to the transfer tube 4A. The semiconductor wafer is transferred to the wafer storing box 3, by allowing the semiconductor wafer to pass through the transfer tube 4A. The wafer storing box 3 have controlled at a humidity of 30% and a temperature of 75° C. The semiconductor wafers are aligned standing at each edges in the wafer storing box 3 so that no stress is applied. In this manner, the semiconductor wafer is conveyed from the spin coating chamber 2A to the wafer storing box 3, in the condition that the atmosphere around the semiconductor wafer, provided with the exposed LKD film 17, is controlled at a humidity of 30% or less and a temperature of 75° C. or more.

(b) Next, the semiconductor wafers, provided with the exposed LKD film 17, are transferred from the spin coating apparatus (first wafer processing equipment) 1A to another wafer processing equipment (the second wafer processing equipment) 1B, by using the wafer storing box 3. During transfer 13 (first transfer period) between the first processing equipment 1A to the second processing equipment 1B, the atmosphere around the semiconductor wafer, stored in the wafer storing box 3, is controlled at a humidity of 30% or less and a temperature of 75° C. or more. By using the humidity control unit 9 and the temperature control unit 8, the above atmosphere around the semiconductor wafer is achieved.

(c) Then, a TEOS film 19 is deposited using the second wafer processing equipment (TEOS film deposition apparatus) 1B. The entire exposed surface 18 of the LKD film 17 is coated with the TEOS film 19. To sate in detail, the door 24 of the storing box 3 is brought into close contact with the inlet port of a transfer tube 4B of the TEOS film deposition apparatus 1B. The door 24 of the storing box 3 is opened in the condition, that the atmosphere in the transfer tube 4B is controlled at a humidity of 30% Or less and a temperature of 75° C. or more. By using the humidity control unit 6 and the temperature control unit 5, the above atmosphere in the transfer tube 4B is achieved. Then, the semiconductor wafers, provided with the exposed LKD film 17, are transferred to the transfer tube 4B. The semiconductor wafers are carried into a TEOS film deposition chamber 2B through the transfer tube 4B. The semiconductor wafers are placed on a sample table. Then, the TEOS film deposition apparatus 1B is allowed to operate to deposit a TEOS film 19, having a predetermined thickness. The TEOS film 19 coats the whole exposed surface 18 of the LKD film 17. After the TEOS film 19 was deposited, the semiconductor wafers are carried out from the TEOS film deposition chamber 2B to the storing box 3 through the transfer tube 4B. At this time, since the LKD film 17 on the semiconductor wafer is not exposed, the atmosphere around the semiconductor wafer may be a normal clean room atmosphere without any problem. It is to be noted that after the TEOS film 19 was deposited, one of the semiconductor wafers was sampled to observe the surface states of the semiconductor wafers. As a result, the occurrence and progress or propagation of cracks were not observed on the sampled semiconductor wafer. It was, therefore, found that resistance to cracks was high.

(d) Then, the semiconductor wafer is scheduled to be transferred from the TEOS film deposition apparatus (the second wafer processing equipment) 1B to the third wafer processing equipment 1C, by using the wafer storing box 3. However, prior to the third wafer processing equipment 1C, the semiconductor wafers are a lithographic process, including photo resist coating, exposure, development, lines, post bake, etc. Since the LKD film 17 on the semiconductor wafer is not exposed in the lithographic process during the transfer 14 between the second wafer processing equipment 1B and the third wafer processing equipment 1C. The atmosphere of the lithographic process around the semiconductor wafers may be a normal clean room atmosphere without any problem.

(e) After the lithographic process is carried out, the semiconductor wafers, coated with the delineated photo resist pattern, are stored in the storing box 3. And the storing box 3 is transferred to the inlet port of the third wafer processing equipment 1C. And a part of the TEOS film 19 and LKD film 17 is selectively removed using the third wafer processing equipment (RIE apparatus) 1C. The RIE apparatus 1C digs a damascene wiring groove 20, and a part of the LKD film 17 is exposed at the sidewall of the damascene wiring groove. To state in detail, the door 24 of the storing box 3 is opened to take out the semiconductor wafers. The semiconductor wafers are allowed to pass through the transfer tube 4C of the RIE apparatus 1C. Each of the semiconductor wafers is placed on a sample table in the RIE chamber 2C. Then, the RIE apparatus 1C is allowed to carry out predetermined anisotropic etching treatment. The RIE apparatus 1C selectively removes the TEOS film 19 and the LKD film 17 in the window parts defined by the delineated photo resist film, to form the damascene wiring groove 20. A W plug 30 is exposed at the bottom of the damascene wiring groove 20.

As shown in the cross sectional view arranged as the left side of the third wafer processing equipment 1C, an exposed portion 21 of the LKD film 17 is formed in a part of the sidewall of the damascene wiring groove 20. The exposed portion 21 is exposed to an atmosphere in the RIE chamber 2C. At this time, the atmosphere in the RIE chamber 2C is controlled at a humidity of 30% or less and a temperature of 75° C. or more. In a separate chamber in the RIE chamber 2C, the photo resist is ashed by an $O_2$ asher. At this time, also, the atmosphere is controlled at a humidity of 30% or less and a temperature of 75° C. or more. After the ashing treatment is finished, the temperature of the substrate is dropped to a predetermined level. At the same time, the atmosphere in the transfer tube 4C is controlled at a humidity of 30% or less and a temperature of 75° C. or more. Then, the semiconductor wafers, provided with the LKD film 17 a part of which is exposed, are carried out to the transfer tube 4C. And the semiconductor wafers allowed to pass through the transfer tube 4C. The semiconductor wafers are transferred to the wafer storing box 3. At that time, the wafer storing box 3 is controlled at a humidity of 30% or less and a temperature of 75° C. or more. The semiconductor wafer is stored in a standing state in the wafer storing box 3, so that no stress is applied. In this manner, in the wafer processing equipment 1C, the semiconductor wafers are provided with the damascene wiring prove, at a part of the saidewall of which the LKD film 17 is exposed. The semiconductor wafers are conveyed from the RIE apparatus 1C to the wafer storing box 3. At this time, the atmosphere around the semiconductor wafers are controlled at a humidity of 30% or less and a temperature of 75° C. or more.

(f) The semiconductor wafer is transferred from the RIE apparatus 1C to the fourth wafer processing apparatus 1D, by using the wafer storing box 3. In this transferring period, the semiconductor wafers are in the state that a part of the LKD film is exposed as in sidewall of the groove. During this transfer period (third transfer period) between the third wafer processing equipment 1C to the fourth wafer processing equipment 1D, the semiconductor wafers are stored in the wafer storing box 3, such that the atmosphere around the semiconductor wafers is controlled at a humidity of 30% or less and a temperature of 75° C. or more. The atmosphere around the semiconductor wafers is achieved by using the humidity control Unit 9 and the temperature control unit 8.

(g) Finally, a metal film 22 is deposited by using the fourth wafer processing equipment 1D (metal film deposition apparatus). The whole exposed portion 21 of the LKD) film 17 is coated with the metal film 22. Specifically, the door 24 of the storing box 3 is brought into close contact with the inlet port of a transfer tube 4D of the metal film deposition apparatus 1D. By using the humidity control unit 6 and the temperature control unit 5, the atmosphere in the transfer tube 4D is controlled at a humidity of 30% or less and the temperature of 75° C. or more. Then, the door 24 of the storing box 3 was opened in the above condition. The semiconductor wafers are transferred to the transfer tube 4D.

The semiconductor wafers are carried into a metal film deposition chamber 2D through the transfer tube 4D, and placed on a sample table. Then, The metal film deposition apparatus 1D deposits a metal film 22 on the TEOS film 19 and inside of the damascene wiring groove 20. The metal film 22 has a predetermined thickness. In the subsequent processes, usual CMP processes and further passivation processes are carried out, because the low dielectric constant insulating film is not exposed.

The sample of the devices that manufactured through the above processes, was subjected to a stress migration (SM) and an electromigration (EM) accelerated test. The sample of the devices was measured for device properties. As a result, no problem arose. On the other hand, in the case of a normal clean room, an LKD film with a thickness of 1.5 μm was formed without controlling the temperature and the humidity around the LKD film. As a result, cracks occurred after baked at 450° C.

(h) One wiring level can be formed by carrying out the above processes. Accordingly, a semiconductor device, having a desired number of wiring levels, can be manufactured by carried out repeatedly the above processes. The electromigration, stress migration and device properties of the sample of this multi-level wiring devices was measured. As a result, no problem arose. No crack of the LKD film was observed.

As explained above, the atmosphere around the semiconductor wafer, which provided with the LKD film at least a part of which is exposed, is controlled at the humidity of 30% or less and the temperature of 75° C. or more. The generation and progress or propagation of cracks in the LKD film can be limited.

The atmosphere around the semiconductor wafer is controlled at the humidity of 25% or less at room temperature (23° C.) or more. It is to be noted that the generation and progress or propagation of cracks can be limited also. The atmosphere is preferably an atmosphere of inert gas including $N_2$ gas Or vacuum. It is also desirable to control low dusts in the storing box 3 and the transfer tube 4. In the first embodiment, the wafers are aligned standing at each edges with the view of removing stress from wafers. In this case, a mechanism for carrying the wafer sideways is required, when the wafer is conveyed. For this, a wafer storing box 3, in which wafers are placed sideways, may be used. The wafer storing box 3 is provided with a support plate for supporting each wafer. Good results were obtained similarly to the case of the standing state. The support plate is provided with slits for inserting a carrier robot arm.

In the first embodiment, the explanations have been furnished taking the LKD film as an example of the low dielectric constant insulating film. However, a low dielectric constant insulating film, containing other organic or inorganic components, is acceptable. For example, as the LKD film, organic SOG films, organic compound addition type $SiO_2$ films, may be used. Further, a SiOF film prepared by adding fluorine to an ordinary $SiO_2$ film is acceptable. The organic SOG films are applied by a spinner. The organic compound addition model $SiO_2$ films are formed by a CVD method. Moreover, the TEOS film is used in the first embodiment. In the case of a device provided with LKD films in all levels to achieve lower dielectricity, the method of forming a metal film is preferably carried out by a following CMP. The CMP uses an organic solvent without using water. At this time, the CMP is desirably carried out in an inert atmosphere having the humidity of 25% or less. The low dielectric constant insulating film may be an insulating film containing silicon, oxygen and fluorine as its major components. Further, the low dielectric constant insulating film may be an insulating film containing an organic component, oxygen and silicon as its major components. The organic component includes a methyl group or an ethyl group.

SECOND EMBODIMENT

Figure 11:
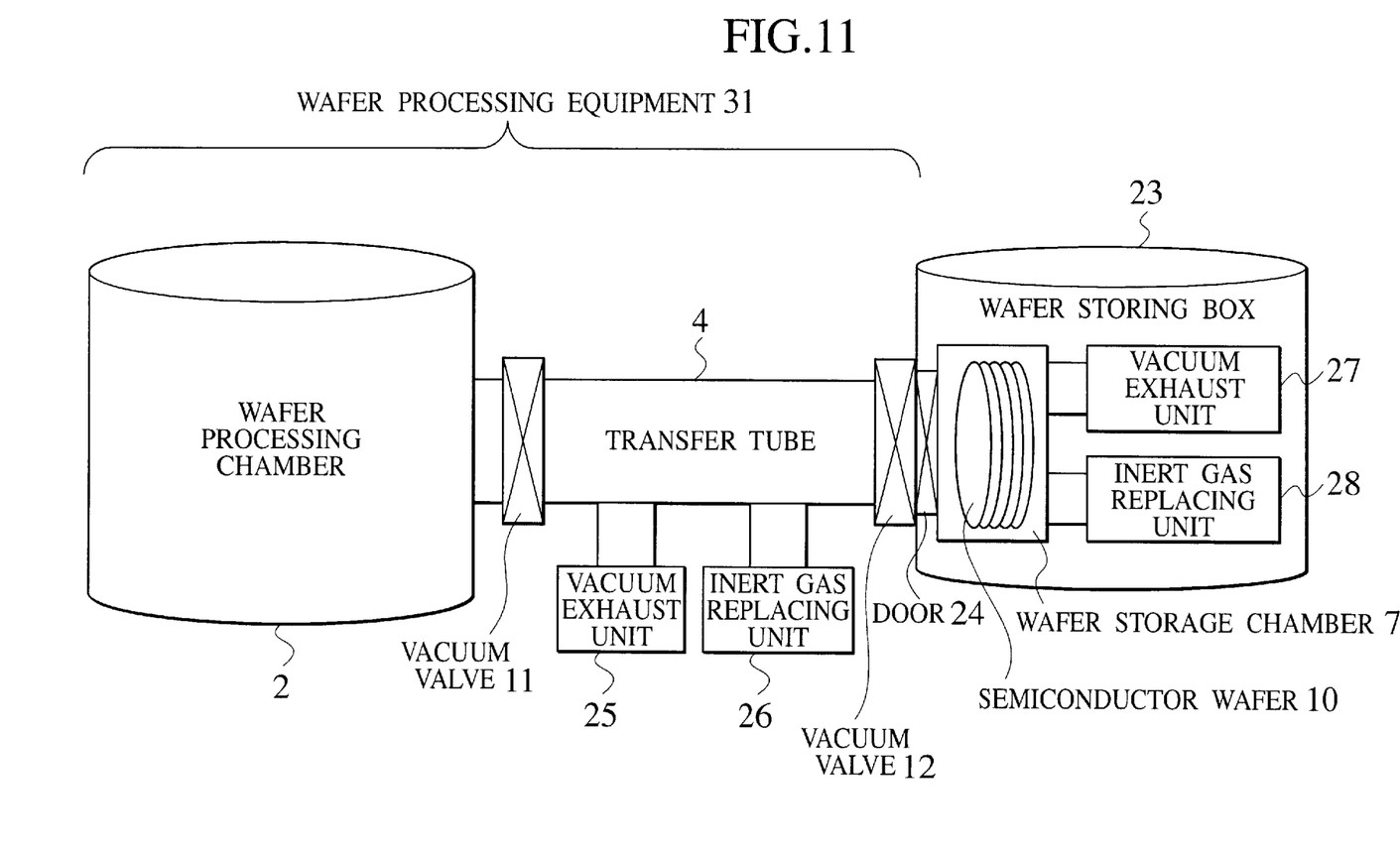
FIG. 11 is a block diagram showing the structures of a wafer processing equipment and a wafer storing box according to a second embodiment of the present invention.

FIG. 11 is a block diagram showing the structures of a wafer processing equipment 31 and a wafer storing box 23, according to the second embodiment of the present invention. As shown FIG. 11, the wafer processing equipment 31 encompasses a wafer processing chamber 2, a transfer tube 4, a vacuum exhaust unit 25, a nitrogen gas replacing unit 26, and vacuum valves (11, 12). The transfer tube 4 is connected to the wafer processing chamber 2. The semiconductor wafer is carried into and out from the wafer processing chamber 2 through the transfer tube 4. The vacuum exhaust unit 25 evacuates air of the transfer tube 4. The nitrogen gas replacing unit 26 replaces the atmosphere in the transfer tube 4 by nitrogen ($N_2$) gas. The vacuum valves (11, 12) is connected respectively to both ends of the transfer tube 4.

The wafer processing chamber 2 may be one of various apparatuses used in all wafer process. The wafer processing chamber 2 includes depositing a low dielectric constant insulating film (for example, SiOF film), exposing at least a part of the low dielectric constant insulating film, coating whole exposed part, and various process performed between these processes, in the same manner as in the first embodiment. The atmospheric ambient around the semiconductor wafer in the wafer processing chamber 2 is controlled at the humidity of 30% or less and the temperature of 75° C. or more. The transfer tube 4 is connected to the wafer processing chamber 2 through the vacuum valve 11. Here, a $SiO_2$ film generally has a dielectric constant of 3.9 to 4.1, though it differs depending on the manufacturing method. On the contrary, a SiOF film, having a low dielectric constant, can be formed by adding fluorine in a $SiO_2$ film. For example, fluorine contained in a concentration of only about 11.0% makes it possible to decrease the dielectric constant to about 3.3. As to also the manufacturing method, the SiOF film can be formed only by mixing additional gas. The additional gas contains fluorine (for example, $NF_3$, $CF_4$ and $C_2F_6$) in the gas ($SiH_4/O_2$ gas or $TEOS/O_2$ gas) used in a plasma CVD method. Therefore, the SiOF film is widely used as one of low dielectric constant insulating films.

The wafer storing box 23 controls the atmospheric ambient around a semiconductor wafer, when the semiconductor wafer is provided with the low dielectric constant insulating film at least a part of which is exposed. The wafer storing box 23 comprises a wafer storing chamber, a vacuum exhausting unit 27, and a nitrogen replacing unit 28. The wafer storing chamber 7 stores the semiconductor wafers on which the low dielectric constant insulating film is deposited. The vacuum exhausting unit 27 evacuates the wafer storing chamber 7 of air. The nitrogen replacing unit 28 rep laces the atmosphere in the wafer storing chamber 7 by nitrogen gas. The wafer storing box 23 is further provided with a door 24. The door 24 is opened and closed in close contact with an inlet/outlet port of the transfer tube 4. The door 24 is adjustable to the size of the inlet/outlet port of the transfer tube 4.

For preventing dielectric breakdown or device destruction by the static electricity, it is desirable that the humidity control unit 26, 28 has an ion generation apparatus. By having the ion generation apparatus, it is possible to perfectly suppress the generation of the trouble by the electrostatic destruction.

A method for manufacturing a semiconductor device, using the water processing equipment 31 and wafer storage box 23, shown in FIG. 11 will be explained.

(a) At first, a SiOF film is deposited on a base substrate, processed as desired in advance. The first wafer processing equipment is a high density plasma CVD apparatus manufactured by Applied Materials, Inc. The formation gas, introduced into the equipment, is mixture gas of $SiH_4/SiF_4O_2/Ar$. The SiOF film after deposited is exposed.

(b) Next, a $SiO_2$ film is formed on the surface of the SiOF film by using second wafer processing equipment (parallel plate type plasma CVD apparatus manufactured by Applied Materials, Inc). The parallel plate type plasma CVD apparatus is different from the first wafer processing equipment. The exposed surface of the SiOF film is coated with the $SiO_2$ film.

(c) Then, a groove and a via-hole, for forming a metal wiring, are digged by using a dry etching apparatus (third wafer process equipment). A part of the SiOF film is exposed in the groove and the via-hole.

(d) Then, a metal film is deposited in the groove, in the via-bole and on the $SiO_2$ film by using fourth wafer process equipment. The exposed portion of the SiOF film is coated with the metal film in the groove and the via-hole.

(e) Then, an unnecessary metal part is removed. The film is flattened by CMP, to form a metal wiring corresponding to one level, The above processes are repeated to thereby form a multi-level wiring structure.

In this series of manufacturing processes, the processing equipment and the transfer period, in which at least a part of the SiOF film is exposed, is limited to the first wafer processing equipment, a period between the first wafer processing equipment and the second wafer processing equipment, the third wafer processing equipment, and a period between the third wafer processing equipment and the fourth wafer processing equipment. Because the first wafer processing equipment and the third wafer processing equipment are performed in a reduced pressure circumstance, the atmospheric ambient around the semiconductor wafer is controlled at the humidity of 30% or less. Problems concerning humidity in the atmospheric ambient around the semiconductor wafer, arise when the semiconductor wafer is carried into and out from the wafer processing equipment. At this time, nitrogen gas is used in order to control the humidity at 30% or less.

Specifically, the semiconductor wafers, which have been processed by predetermined wafer treatment, are carried out from the wafer processing chamber 2 to the transfer tube 4. At this time, the atmosphere in the transfer tube 4 is controlled using the method shown below. The vacuum valves (11, 12) on both ends of the transfer tube 4 are closed. The atmospheric ambient in the transfer tube 4 is evacuated using the vacuum exhaust unit 25. Then, when the evacuation is completed to a prescribed vacuum level, the evacuation is stopped. Dry nitrogen gas is introduced into the transfer tube 4 by using the nitrogen gas replacing unit 26. The vacuum valve 11 is opened in the condition of the transfer tube 4 with an atmospheric ambient, substituted with dry nitrogen gas by the above procedures. The semiconductor wafers, stored in the wafer processing chamber 2, are transferred to the transfer tube 4. In the same procedures as above, the atmospheric ambient in the wafer storing chamber 7 of the storing box 23 is replaced by dry nitrogen. The vacuum valve 12 is opened to carry out the semiconductor wafers to the wafer storing box 23. The semiconductor wafers are handled in this manner during carry-in and carry-out between the first wafer processing equipment and the second wafer processing equipment, and between the third wafer processing equipment and the forth wafer processing equipment. The humidity around the semiconductor wafers provided with the SiOF film, a part of which is exposed, can be controlled at 30% or less.

As described above, in the method for manufacturing a semiconductor device formed with the SiOF film, the atmospheric ambient around the semiconductor wafers provided with the SiOF film, a part of which is exposed, is controlled at a humidity 30% or less. The atmospheric ambient around the semiconductor wafers is achieved by using the vacuum exhaust unit (25, 27) and The nitrogen gas replacing unit (26, 28). It can be limited that the occurrence and progress or propagation of cracks in the SiOF film, and the problem concerning the peeling of the upper level metal film. The peeling is caused in the heating processes.

In the second embodiment, the wafer processing equipment 31 and the wafer storing box 23 are provided with the vacuum exhaust unit (25, 27) and the nitrogen gas replacing unit (26, 28) respectively is explained. However, even if the wafer processing equipment 31 and the wafer storing box 23 are provided with either one of these units, the effect of the second embodiment is manufactured. For example, in the case of using only the vacuum exhaust unit (25, 27), the atmospheric ambient around the semiconductor wafer may be in vacuum (reduced pressure) state. On the other hand, in the case of using only the nitrogen gas replacing unit (26, 28), the atmospheric ambient around the semiconductor wafers can be filled with dry nitrogen gas. The atmospheric ambient is achieved by flowing nitrogen gas always under uplift pressure in the transfer tube 4 and the wafer storing chamber 7. In this case, an inert gas atmospheric ambient using inert gas other than nitrogen gas may be adopted. It is possible to use, for example, hydrogen ($H_2$) gas or rare gas such as He, Ar or Kr.

In the second embodiment, explanations are furnished, taking the SiOF film prepared by adding fluorine to an ordinary $SiO_2$ film, as an example of the low dielectric constant insulating film. A low dielectric constant insulating film containing other organic or inorganic components may be used. It may be used that LKD films such as organic SOG films and organic compound-addition $SiO_2$ films. The organic SOG films is applied by a spinner. The organic compound-addition $SiO_2$ is formed by a CVD method.

According to the embodiments of the present invention, the crack resistance and adhesion of the low dielectric constant insulating film are improved. Therefore a highly reliable semiconductor device can be manufactured in a high yield. Further, the absorption of moisture, in the low dielectric constant insulating film, is suppressed. The processes of manufacturing the semiconductor device can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:

controlling a humidity in an atmosphere around a low dielectric constant insulating film at 30% or less during a processing period and a transfer period between processing equipments in which at least a part of said low dielectric constant insulating film is exposed to the atmosphere, wherein said processing period and said transfer period includes: depositing said low dielectric constant insulating film above a semiconductor wafer; first coating a whole exposed surface of said low dielectric constant insulating film with a metal film or an insulating film having a dielectric constant more than 3.8; and a first transfer period during said low dielectric constant insulating film is exposed between said depositing and said first coating, wherein the humidity around the semiconductor wafer is controlled at 30% or less during said depositing, said first coating and said first transfer period.

2. The method of claim 1, wherein a temperature around the semiconductor wafer is controlled at 75° C. or more during said depositing, said first coating and said first transfer period.

3. The method of claim 1, wherein the humidity around the semiconductor wafer is controlled at 25% or less and a temperature around the semiconductor wafer is controlled at 23° C. or more during said depositing, said first coating and said first transfer period.

4. The method of claim 1, wherein said processing period and said transfer period further includes:

exposing at least a part of said low dielectric constant insulating film;

second coating a whole exposed surface of said low dielectric constant insulating film with a metal film or an insulating film having a dielectric constant more than 3.8; and a second transfer period during at least a pan of said low dielectric constant insulating film is exposed between said exposing and said second coating, wherein the humidity around the semiconductor wafer is controlled at 30% or less during said exposing, said second coating and said second transfer period.

5. The method of claim 4, wherein a temperature around the semiconductor wafer is controlled at 75° C. or more during said depositing, said first coating, said first transfer period, said exposing, said second coating and said second transfer period.

6. The method of claim 4, wherein the humidity around the semiconductor wafer is controlled at 25% or less and a temperature around the semiconductor wafer is controlled at 23° C. or more during said depositing, said first coating, said first transfer period, said exposing, said second coating and said second transfer period.

7. The method of claim 1, wherein said low dielectric constant insulating film has a dielectric constant of 3.8 or less.

8. The method of claim 7, wherein said low dielectric constant insulating film contains silicon, oxygen and fluorine as its major components.

9. The method of claim 7, wherein said low dielectric constant insulating film contains a methyl group or an ethyl group, silicon and oxygen as its major components.

* * * * *